United States Patent [19]

Nakanishi et al.

[11] Patent Number: 5,793,785
[45] Date of Patent: Aug. 11, 1998

[54] SEMICONDUCTOR LASER DEVICE

[75] Inventors: Hideyuki Nakanishi, Kyoto; Akio Yoshikawa, Ibaraki; Hirokazu Shimizu, Suita, all of Japan

[73] Assignee: Matsushita Electronics Corporation, Osaka, Japan

[21] Appl. No.: 509,695

[22] Filed: Jul. 31, 1995

Related U.S. Application Data

[63] Continuation-in-part of Ser. No. 206,052, Mar. 4, 1994, Pat. No. 5,479,426.
[51] Int. Cl.$^6$ .................. H01S 3/19; H01S 3/045
[52] U.S. Cl. .......................... 372/36; 372/44
[58] Field of Search ............................ 372/36, 44

[56] References Cited

U.S. PATENT DOCUMENTS 4,807,238  2/1989  Yokomori .................. 372/36

FOREIGN PATENT DOCUMENTS

| 1-150244 | 6/1989 | Japan . |
| 4-155976 | 5/1992 | Japan . |
| 4-196189 | 7/1992 | Japan . |
| 4-349687 | 12/1992 | Japan . |

*Primary Examiner*—James W. Davie
*Attorney, Agent, or Firm*—Ratner & Prestia

[57] ABSTRACT

Radiating light from a semiconductor laser element is radiated in a direction normal to the surface of a photodetector substrate. The semiconductor laser element and photodetector are disposed on the same plane. Specifically, a reflecting mirror surface formed of a slanting surface of (111) lattice plane having a ridge line of <110> direction is disposed on a silicon substrate of (100) lattice plane having an off-angle of 4° to 14° about an axis of <110> direction or on a silicon substrate of (511) lattice plane having an off-angle of 1° to 11° about an axis of <110> direction. The semiconductor laser chip is disposed at a position opposing to the reflecting mirror surface.

6 Claims, 10 Drawing Sheets

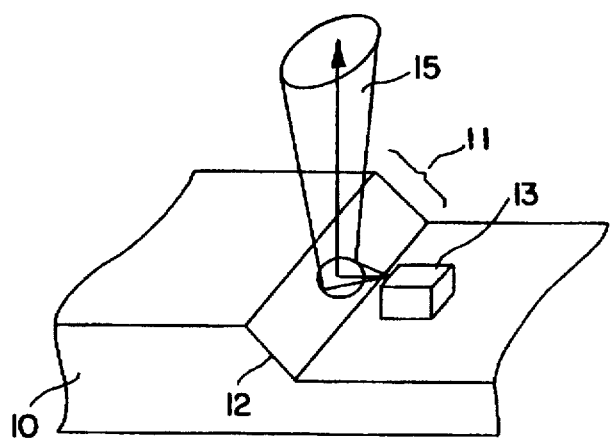
FIG. I(a)
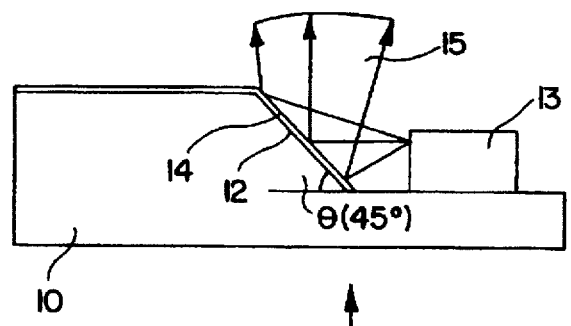
FIG. I(b)
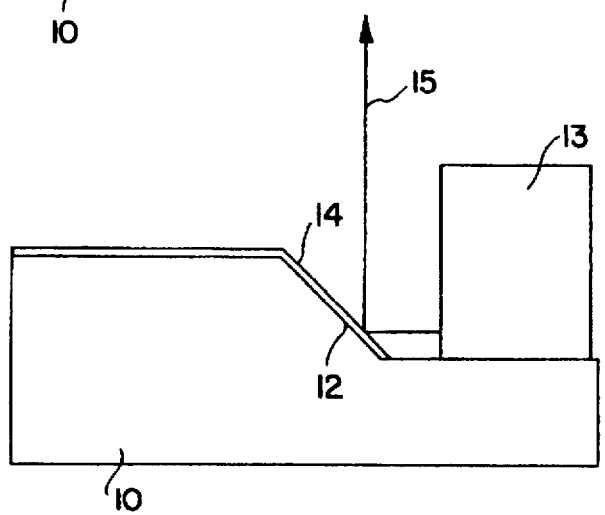
FIG. 2
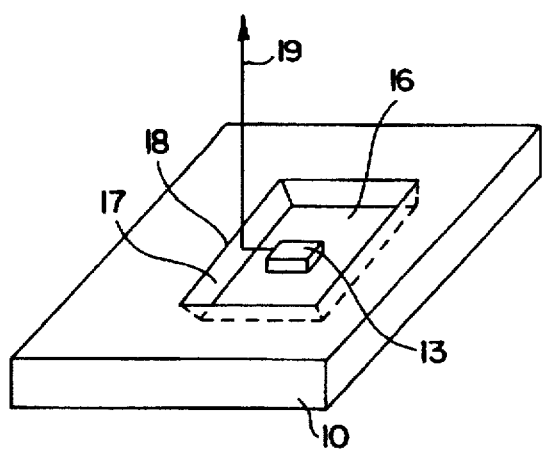
FIG. 3

SEMICONDUCTOR LASER DEVICE

CROSS REFERENCE TO RELATED APPLICATIONS

This application is a continuation in part of application Ser. No. 08/206,052 filed Mar. 4, 1994 entitled "Semiconductor Laser Device", now Pat. No. 5,479,426.

BACKGROUND OF THE INVENTION

The present invention relates to a semiconductor laser device which finds applications in optical information processing, optical measurement, optical communication or the like.

A prior art semiconductor laser device will be explained with the help of a cross-sectional view thereof as shown in FIG. 21.

The device includes a heat sink 2 fixed on a side of an element mounting base 1 and a semiconductor laser chip 3 (referred to as "laser chip" hereafter) mounted on heat sink 2. The light radiating surface of the laser chip 3, the upper side of the heat sink 2 and the upper surface of the element mounting base 1 are made flush with one another, and at the same time a laser output light detecting photodiode 4 is placed at a lower position opposite to the light radiating surface of the laser chip 3 and also a signal detecting photodiode 5 is placed on the upper side of the element mounting base 1.

Next, operation of the device having the foregoing structure will be explained.

The radiating light 6 sent from the laser chip 3 towards the upper direction of FIG. 21 is reflected by an object and inputted to the signal detecting photodiode 5 as reflected light 7 for signal processing. On the other hand, the laser light sent out from the surface opposite to the light radiating surface of the laser chip 3 is inputted to the laser output light detecting photodiode 4 and converted to electric current signals corresponding to the intensity of the laser light. The electric current signals are fed back to a laser chip driving circuit for controlling the output of the laser light in a stabilized manner.

With the foregoing prior art structure, the required assembly work can not be performed efficiently and the position alignment accuracy may be a problem because the laser chip 3 is desirably mounted within a vertical plane while the signal detecting photodiode 5 is mounted horizontally and the laser output light detecting photodiode 4 is mounted within an almost horizontal plane on the element mounting base 1, respectively.

A structure intended for solving the foregoing problem is employed in a semiconductor laser device, of which a cross-sectional view is shown in FIG. 22.

The structure has a V-shaped groove formed on a silicon substrate of (100) lattice plane, both the slanting surfaces of which are formed of (111) lattice plane. One of the slanting surfaces of the groove serves as a reflecting mirror surface 9 whereby radiating laser light is reflected. The main surface of the silicon substrate 8 which joins the other slanting surface is made lower than the other main surface of the silicon substrate 8, and a laser chip 3 is mounted on the lower main surface of the silicon substrate 8 with its front end surface, where the laser light from the laser chip is radiated, disposed in parallel with the ridge where the lowered main surface of the silicon substrate and the slanting surface of the V-shaped groove meet each other.

With the foregoing structure, the laser light radiated horizontally from the laser chip 3 is reflected at the reflecting mirror surface 9 and can be taken out in an almost vertical direction. Accordingly, a signal detecting photodiode (not shown in FIG. 22) and a laser output detecting photodiode (not shown in FIG. 22) can be formed on the main surface of the silicon substrate 8 with high accuracy by means of photolithography.

However, when a V-shaped groove is formed on a silicon substrate 8 of.(100) lattice plane with slanting surfaces of (111) lattice plane, there has been a problem that the slanting angle θ between the reflecting mirror surface 9 and the surface of the silicon substrate 8 is about 54°, causing the center axis of the radiating laser light to tilt from the direction perpendicular to the main surface of the silicon substrate by about 18°.

The inventors presently believe the reason why the reflecting mirror surface 9 inherently makes an angle of about 54° with the surface of the silicon substrate 8 is because the silicon substrate used here is not cut out with an off-angle of 4° to 14° about an axis of <110> direction as disclosed by the present invention.

SUMMARY OF THE INVENTION

A semiconductor laser device has a structure wherein a level difference or a V-shaped groove having a slanting surface of (111) lattice plane with its ridge arranged in <110> direction is formed on a silicon substrate of (100) lattice plane which makes an off-angle of 4° to 14° about an axis of <110> direction or on a silicon substrate of (511) lattice plane which makes an off-angle of 1° to 11° about an axis of <110> direction. The (111) slanting surface is used as a reflecting mirror surface whereby laser light is reflected, and a semiconductor laser chip is placed at a position on the bottom of the level difference and opposite to the reflecting mirror with the lower ridge of the front end surface of laser chip 13 disposed almost in parallel with the ridge of either the level difference or V-shaped groove. Also, a laser output light detecting photodiode is formed on the silicon substrate within the reflecting mirror surface or on the silicon substrate behind the semiconductor laser chip. A signal detecting photodiode, a laser driving circuit, an amplifying circuit and a light signal processing circuit may be formed on the silicon substrate.

According to the foregoing structures, it is possible to make the angle θ between the slanting surface of (111) lattice plane for the level difference or V-shaped groove and the main surface of the silicon substrate fall in the range of 40°≦θ≦50° because the main surface of the silicon substrate makes an off-angle of 4° to 14° with (100) lattice plane or an off-angle of 1° to 11° with (511) lattice plane. As a result, it is possible to make the center axis of the laser light radiated from the laser chip and then reflected by the reflecting mirror surface almost perpendicular to the main surface of the silicon substrate.

Forming the laser output light detecting photodiode, the signal detecting photodiode, the laser driving circuit, the amplifying circuit and the light signal processing circuit on the silicon substrate which is mounted with the laser chip and also serving as a heat sink makes it possible to reduce the number of components greatly when compared with the case where the foregoing elements are put together separately. The angle correction step at the time of assembly is simplified. In addition, the assembly work is simplified with a resultant contribution to cost reduction.

BRIEF DESCRIPTION OF THE DRAWINGS

FIGS. 1(a) and 1(b) respectively show a perspective view and a cross-sectional view of a semiconductor laser device according to an exemplary embodiment of the present invention having a level difference.

FIG. 2 shows a cross-sectional view of a semiconductor laser device according to an exemplary embodiment of the present invention having a laser chip mounted with its crystal growth side down.

FIG. 3 shows a perspective view of a semiconductor laser device according to an exemplary embodiment of the present invention having a truncated quadrangular pyramid like concaved area.

FIG. 9 shows a cross-sectional view of a semiconductor laser device according to an exemplary embodiment of the present invention incorporated with such optical elements as an object lens, a prism, a polarizing plate or the like.

DETAILED DESCRIPTION OF THE INVENTION

EXAMPLE 1

Figure 4:
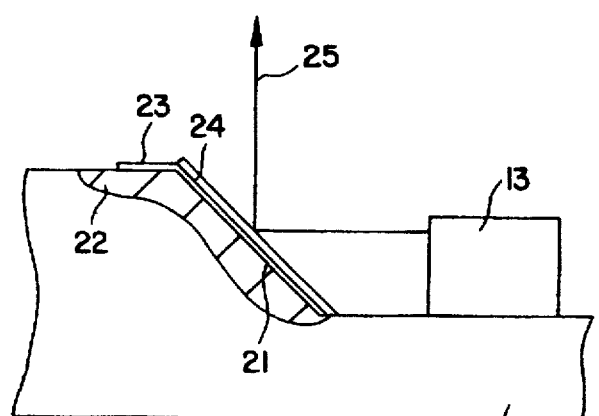
FIG. 4 shows a cross-sectional view of a semiconductor laser device according to an exemplary embodiment of the present invention having a photodiode formed at the side of a reflecting mirror surface.

A semiconductor laser device in accordance with a first exemplary embodiment of the present invention will be explained with the help of a perspective view and cross-sectional view as shown in FIGS. 1(a) and 1(b), respectively.

The device has a structure wherein a level difference 11 is formed on a silicon substrate 10 of (100) lattice plane making an off-angle of some 9° about a rotational axis of <110> direction so as to have its ridge disposed in parallel with <110> direction and to make its slanting surface coincided with (111) lattice plane. The slanting surface of the level difference is used as a reflecting mirror surface 12, and a laser chip 13 is mounted on the lower level surface of the silicon substrate 10 at a position opposite to the reflecting mirror surface 12, and is disposed to make the lower ridge of the front end surface of its laser chip 13 be in parallel with the one of the reflecting mirror surface 12. Although there are two kinds of (111) lattice plane which has its ridge situated in parallel with <110> direction, e.g. one making an angle of about 45° and the other making an angle of 63° with the substrate surface with the foregoing structure using the silicon substrate 10, only the level difference with the slanting surface of about 45° is shown here. Such a level difference 11 having a slanting surface of (111) lattice plane can be readily realized by the steps of forming an etching mask of an oxide film on the silicon substrate 10, and etching with an anisotropic etching solution such as potassium hydroxide solution, ethylenediamine or the like.

A thin gold film 14 of 3000 A to 5000 A is formed on the reflecting mirror surface 12 to realize reflectivity of more than 90%. According to the foregoing structure, the majority of the laser light radiated from the laser chip 13 in the horizontal direction is reflected by the reflecting mirror, as shown by an optical path 15, in the vertical or nearly vertical direction and taken out as output light.

With the present example, the laser chip 13 is mounted by soldering with its crystal growth surface side (light radiating surface side) faced upward, and the position of radiating light point varies from device to device because of a rather large spread in thickness of the laser chips 13 themselves extending as widely as ±20 um. Therefore, mounting the laser chip 13 with its crystal growth surface side face down results in reducing effectively the spread of variations in the position of radiating light point to the level of variations in thickness (±20 um) of the crystal growth thin film of the laser chip 13. This effect equally applies to other exemplary embodiments that will be described later.

Although (100) lattice plane having an off-angle of some 9° about an axis of <110> direction was used as the surface of the silicon substrate 10, use of (100) lattice plane with a more practical off-angle ranging from 4° to 14° could suppress the variation spread of the slanting angle θ between the reflecting mirror surface 12 and the surface of the silicon substrate 10 to a range of 40°≦θ≦50°, resulting in almost the same effect of realizing a reflecting mirror surface 12 of close to 45°. Besides, by employing a silicon substrate equivalent to the foregoing silicon substrate 10 with (511) lattice plane having an off-angle ranging from 1° to 11° about an axis of <110> direction or other equivalent silicon substrates with different lattice planes having appropriate off-angles, it is possible to achieve the same effect. The same thing can be said of other exemplary embodiments that will follow.

Next, a semiconductor laser device in accordance with a second exemplary embodiment of the present invention will be explained with the help of a perspective view shown in FIG. 3.

The device has a structure wherein a truncated quadrangular pyramid like concaved area having four side surfaces of (111) lattice plane is formed on a silicon substrate 10 of (100) lattice plane off-angled as explained in FIGS. 1(a) and 1(b), one of the four side surfaces of (111) lattice plane making an angle closest to 45° with the surface of the silicon substrate 10 is used as a reflecting mirror surface 17 where the laser light is reflected, and a laser chip 13 is mounted on the bottom of the concaved area 16 of a truncated quadrangular pyramid at a position opposing to said reflecting mirror surface 17 with the lower ridge of the front end surface of the laser chip 13 disposed in parallel with the ridge 18 of the reflecting mirror surface 17. The structure of the reflecting mirror surface 17 and that of the laser chip 13 are the same as explained in FIGS. 1(a) and 1(b).

According to the foregoing structure, the majority of the laser light radiated from the laser chip 13 in the horizontal direction is reflected by the reflecting mirror 17, as shown by an optical path 19, in the vertical or nearly vertical direction, and taken out as output light.

Next, a semiconductor laser device as a third exemplary embodiment of the present invention will be explained with the help of a cross-sectional view as shown in FIG. 4.

The device has a structure wherein a level difference as shown in FIGS. 1(a) and 1(b) or a truncated quadrangular pyramid like concaved area as shown in FIG. 3 is formed on a p-type silicon substrate 20 of (100) lattice plane having an off-angle of some 9° about a rotation axis of <110> direction, a slanting surface of the level difference or concaved area making an angle closest to 45° with the surface of the silicon substrate 20 is used as a reflecting mirror surface 21 where laser light is reflected, an n-type diffusion region 22 is formed on the slanting surface at the side of the p-type silicon substrate 20, a silicon oxide film 23 for insulation and a thin gold film 24 are formed sequentially on the reflecting mirror surface 21, and a laser chip 13 is mounted on the bottom of the level difference or concaved area with the lower ridge of the front end surface of the laser chip 13 disposed in parallel with the ridge of the reflecting mirror surface 21.

Further, the thin gold film 24 is made half transparent by controlling its thickness within a range of 200 A to 1000 A in order for a part of the laser light to have to a photodiode formed of the p-type silicon substrate 20 and the n-type diffusion region 22.

According to the foregoing structure, a part of the laser light radiated from the laser chip 13 in the horizontal direction is passed through the half transparent film formed of the thin gold film 24 to get to the photodiode and the rest is reflected by the half transparent film, as shown by an optical path 25, in the vertical or nearly vertical direction and taken out as output light.

The light irradiated on the photodiode is converted to an electric current signal according to the light intensity, and the electric current signal is fed back to a laser chip driving circuit to keep the laser light output constant. Also, the same effect as above can be achieved even when the conductivity types are reserved between the p-type silicon substrate 20 and the diffusion region 22.

Figure 5:
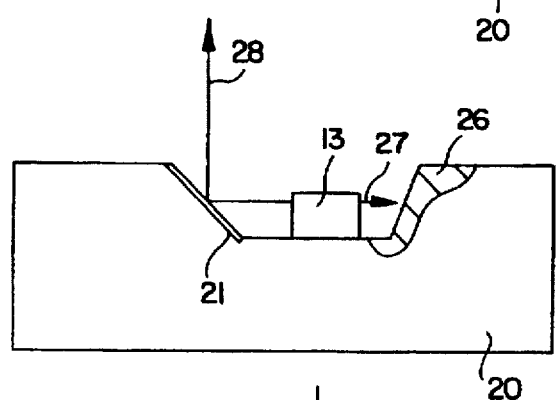
FIG. 5 shows a cross-sectional view of a semiconductor laser device according to an exemplary embodiment of the present invention having a photodiode formed behind a laser chip.

A semiconductor laser device as a fourth exemplary embodiment of the present invention will be explained with the help of a cross-sectional view as shown in FIG. 5.

The device has a structure wherein a level difference as shown in FIGS. 1(a) and 1(b) or a truncated quadrangular pyramid like concaved area as shown in FIG. 3 is formed on a p-type silicon substrate 20 of (100) lattice plane having an off-angle of some 9° about a rotation axis of <110> direction, a slanting surface of the level difference or concaved area making an angle closest to 45° with the surface of the silicon substrate 20 is used as a reflecting mirror surface 21 where laser light is reflected, a laser chip 13 is mounted on the bottom of the level difference or concaved area with the lower ridge of the front end surface of the laser chip 13 disposed in parallel with the ridge of the reflecting mirror surface 21, and an n-type diffusion region 26 is formed on the p-type silicon substrate 20 behind the laser chip 13.

The laser light radiated from the back end surface of the laser chip 13 is received by a photodiode formed of the p-type silicon substrate 20 and n-type diffusion region 26, and an electric current signal is generated and changed according to the light intensity. The electric current signal is fed back to a laser chip driving circuit and used as a monitor for keeping constant the intensity of the laser light radiated from the front end surface of the laser chip 13. The same effects as the foregoing can be achieved even when the conductivity types are reversed between the silicon substrate and diffusion region.

The laser light radiated from the front end surface of the laser chip 13 in the horizontal direction is reflected by the reflecting mirror surface 21 coated with a thin gold film in the vertical or nearly vertical direction and taken out as output light.

An optical path of the laser light radiated from the back end surface of the laser chip 13 and an optical path of the laser light radiated from the front end surface of the laser chip 13 are indicated by 27 and 28, respectively.

Next, a semiconductor laser device according to a fifth exemplary embodiment of the present invention will be explained with the help of a perspective view shown in FIG. 6.

The device has a structure wherein a concaved area 16 like a truncated quadrangular pyramid with its slanting surfaces formed of (111) lattice plane is formed on a p-type silicon substrate 20 of (100) lattice plane having an off-angle of some 9° about a rotation axis of <110> direction, one of the slanting surfaces making an angle closest to 45° against the surface of the silicon substrate 20 is used as a reflecting mirror surface 17, a laser chip 13 is mounted on the bottom of the truncated quadrangular pyramid like concaved area at a position opposite to the slanting surface with the lower ridge of the front end surface of the laser chip 13 disposed in parallel with the ridge of the reflecting mirror surface 17, a laser output light detecting photodiode 29 is formed behind the laser chip 13 by forming an n-type diffusion region, and further a signal detecting photodiode 30 is formed on the silicon substrate 20.

According to the foregoing structure, the laser light radiated from the front end surface of the laser chip 13 in the horizontal direction is reflected by the reflecting mirror surface 17 coated with a thin gold film in the vertical or nearly vertical direction as shown by an optical path 19, and taken out as output light.

The foregoing output light is reflected by an object to make a signal light 31 which is fed into the signal detecting photodiode 30 for signal processing. On the other hand, the laser light radiated from the back end surface of the laser chip 13 is inputted to the laser output light detecting photodiode 29 and converted to an electric current signal according to the light intensity. The electric current signal is fed back to a laser chip driving circuit and used for keeping constant the output of the laser light radiated from the front end surface of the laser chip 13.

According to the foregoing structure, it is made possible to put together the whole assembly into a compact integrated unit because the laser output light detecting photodiode 29 and signal detecting photodiode 30 are formed on the same silicon substrate 20.

Although only the photodiodes 29 and 30 for laser output light detecting and signal detecting were formed on the same silicon substrate with the foregoing exemplary embodiment, it is also possible to form an amplifying circuit for signals outputted from photodiodes, the driving circuit of the laser chip 13, a light signal processing circuit and the like on the same silicon substrate 20. Also, the same effect as the foregoing can be achieved even when the conductivity types are reversed between the silicon substrate and the diffusion region.

Figure 7:
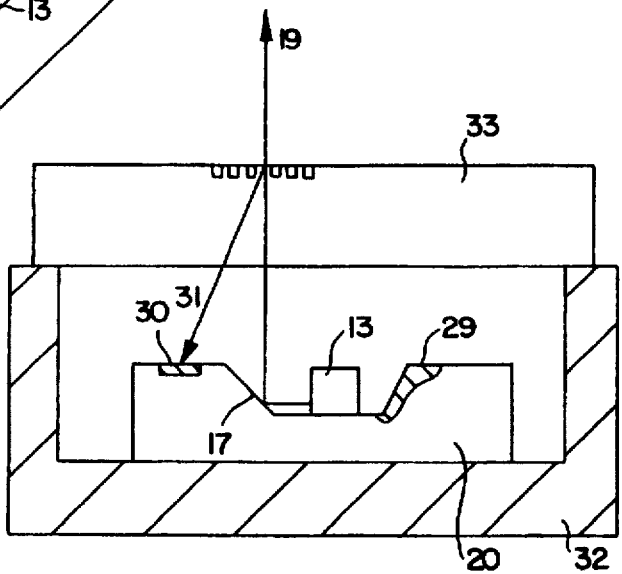
FIG. 7 shows a cross-sectional view of a semiconductor laser device according to an exemplary embodiment of the present invention having a hologram optical element incorporated.

Next, a semiconductor laser device according to a sixth exemplary embodiment of the present invention will be explained with the help of a cross-sectional view shown in FIG. 7.

Figure 6:
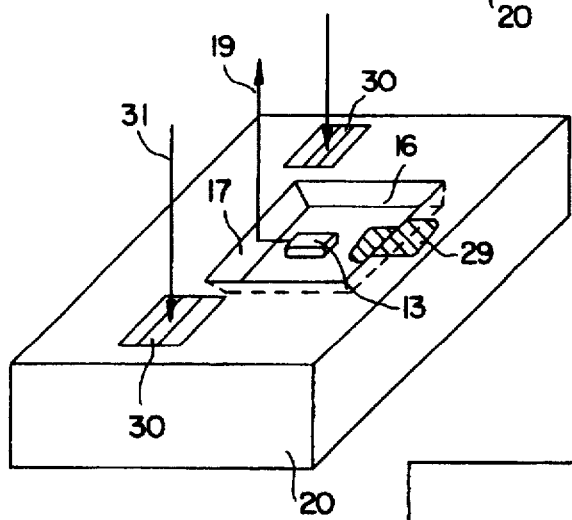
FIG. 6 shows a perspective view of a semiconductor laser device according to an exemplary embodiment of the present invention having various kinds of elements formed on the silicon substrate where a laser chip is mounted.
Figure 8:
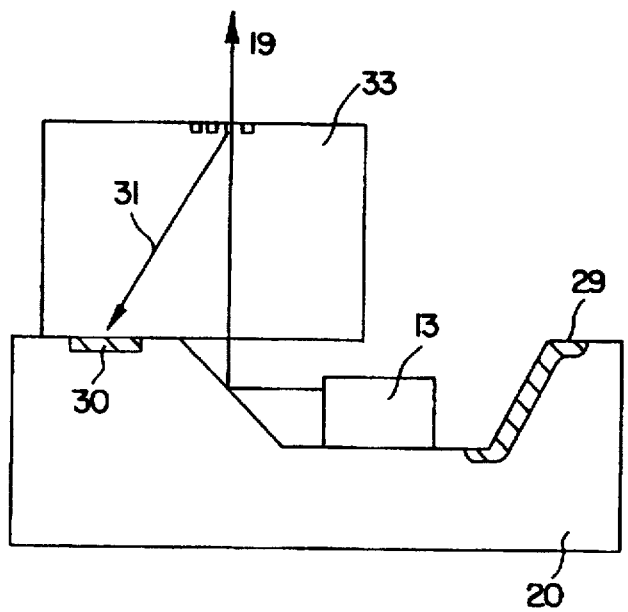
FIG. 8 shows a cross-sectional view of a semiconductor laser device according to an exemplary embodiment of the present invention having a hologram optical element directly incorporated with a silicon substrate.
Figure 9:
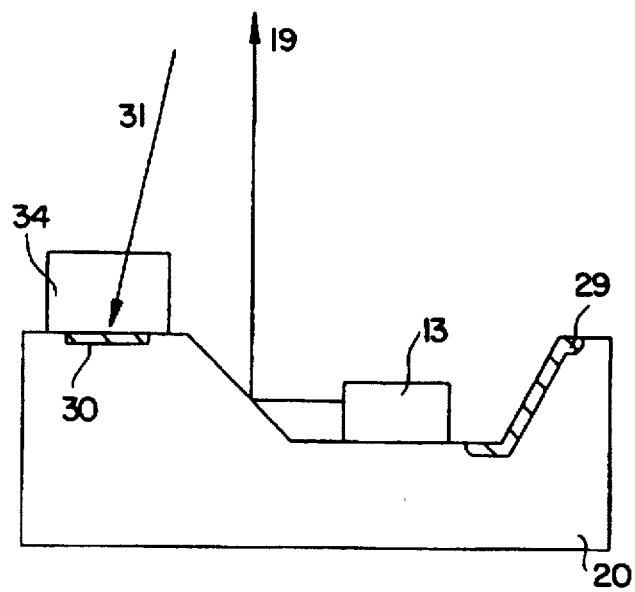

The present exemplary embodiment deals with a semiconductor laser device wherein the semiconductor laser device illustrated in FIG. 6 is contained in a package 32, and further a hologram light element 33 is disposed on top of the package 32 with resulting integration with the hologram light element 33. Because the hologram light element is located closely, positional adjustments with the laser chip 13 and photodiodes 29 and 30 are facilitated with a resultant contribution to enhanced accuracy. Besides, by having the hologram light element 33 directly disposed on the silicon substrate 20 as shown in FIG. 8, the positional adjustments can be made much easier, resulting in the achievement of much effectiveness. Although the case of incorporating the hologram light element 33 was explained, the same effects can be achieved with the use of optical elements such as an object lens, a prism, a polarizing plate or the like as shown in FIG. 9. The foregoing effects are equally applicable to the exemplary embodiments that will follow.

EXAMPLE 2

Figure 10A:
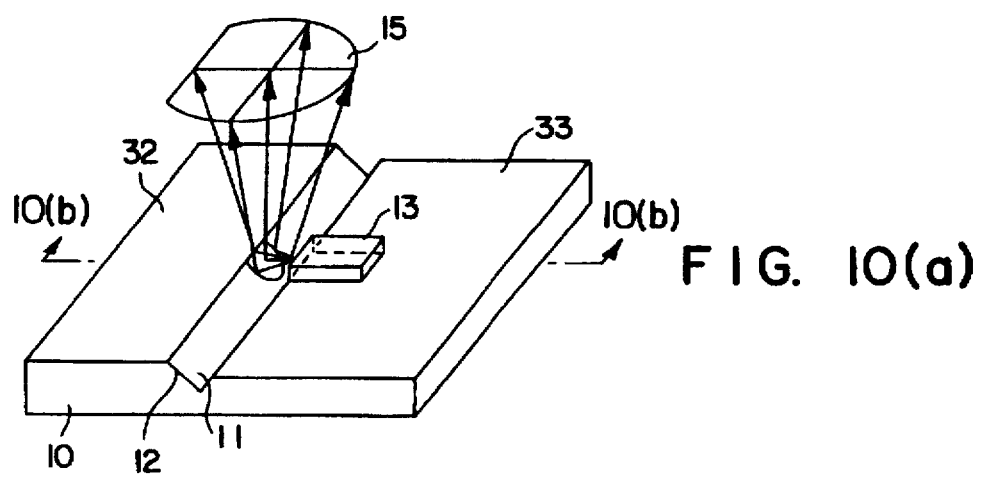
FIGS. 10(a) and 10(b) respectively show a perspective view and cross-sectional view of a semiconductor laser device according to an exemplary embodiment of the present invention having the main surface of a silicon substrate separated by a V-shaped groove into two sections with one section made lower than the other.

A semiconductor laser device according to a first exemplary embodiment of the present invention will be explained with the help of a perspective view as shown in FIG. 10(a) and a cross-sectional view cut along a line A—A of the perspective view and shown in FIG. 10(b).

The device has a structure wherein a V-shaped groove 11 (referred to as a V-groove hereafter) having both the slanting surfaces formed of (111) lattice plane is disposed on a silicon substrate 10 of (511) lattice plane having an off-angle of some 6° about a rotation angle of <110> direction, one of the slanting surfaces making an angle θ closer to 45° with the surface of the silicon substrate 10 is used as a reflecting mirror surface 12, the main surface 33 of the silicon substrate which is situated opposite to the reflecting mirror surface 12 is made lower than the other main surface 32 of the silicon substrate, and further a semiconductor laser chip 13 is mounted on the surface of the silicon substrate 10 so as to have the lower ridge of the front end surface of the laser chip 13 disposed in parallel with the ridge of the other slanting surface of the V-groove opposing to said reflecting mirror surface 12. Such a V-groove having slanting surfaces of (111) lattice plane can be readily realized by the steps of forming an oxide film etching mask on the silicon substrate 10, and etching with an anisotropic etching solution such as potassium hydroxide solution, ethylendiamine or the like. Besides, a thin gold film 14 of 3000 A to 5000 A is formed on the reflecting mirror surface 12 to gain reflectivity of more than 90%. Further, the laser chip 13 is mounted by soldering with its light radiating surface side faced down.

According to the foregoing structure, the laser light radiated from the laser chip 13 in the horizontal direction is reflected by the reflecting mirror in the vertical or nearly vertical direction as shown by an optical path 15 and taken out as output light.

Although (511) lattice plane having an off-angle of some 6° was used as the surface of the silicon substrate 10, use of (511) lattice plane with a more practical off-angle ranging from 1° to 11° can be equally good. At this time, the variation spread of the slanting angle θ between the reflecting mirror surface 12 and the surface of the silicon substrate 10 can be suppressed to a range of 40°≦θ≦50°, resulting in almost the same effect because a reflecting mirror surface 12 of close to 45° is realized. Also, by employing a silicon substrate equivalent to the foregoing silicon substrate 10 with (100) lattice plane having an off-angle ranging from 4° to 14° about an axis of <110> direction or other equivalent silicon substrates with different lattice planes having appropriate off-angles, it is possible to achieve the same effect. The same thing can be said of other exemplary embodiments that will follow.

Figure 10B:
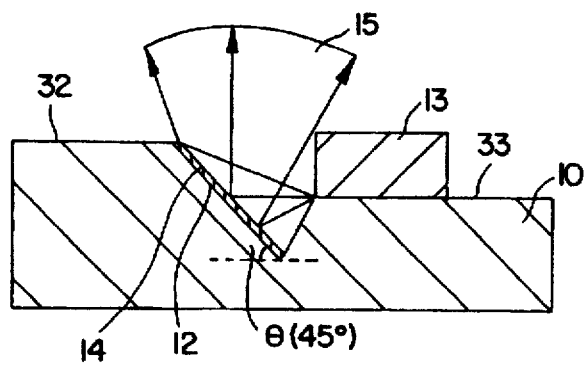

Also, the laser chip 13 may be mounted with its light radiating surface side (crystal growth surface side) faced upward instead of fixing its light radiating surface side serving as the adhesion surface as shown in FIGS. 10(a) and 10(b), but in this case the position of radiating light point varies from device to device because of a rather large spread in the laser chip thickness extending as widely as ±20 um.

Therefore, mounting the laser chip 13 with its light radiating surface side faced down results in reducing the spread of variations in the distance of the radiating light point from the silicon substrate 10 to the level of ±20 um, and contributing effectively to enhancement of the positional accuracy of the light radiating point. This effect equally applies to other exemplary embodiments that will be described later.

Besides, when the V-groove is formed by etching, it is not necessary to etch to the deepest point of the V shape, and etching to form a trapezoid-shaped groove can be equally effective as far as the necessary portion of the radiating light from the semiconductor laser chip is reflected. This is equally applicable to other exemplary embodiments that will be described later.

Figure 11A:
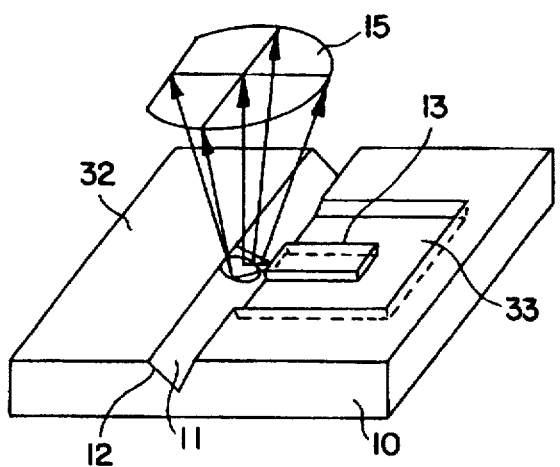
FIGS. 11(a) and 11(b) respectively show a perspective view and cross-sectional view of a semiconductor laser device according to an exemplary embodiment of the present invention having the area of the main surface of a silicon substrate made lower limited to an area where at least a laser chip can be accommodated.
Figure 11B:
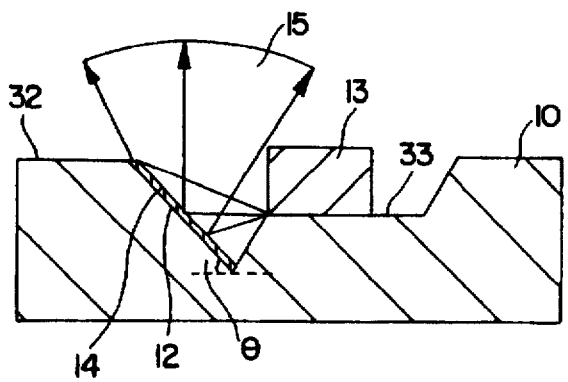

Next, a semiconductor laser device as a second exemplary embodiment of the present invention will be explained with the help of a perspective view and a cross-sectional view as shown in FIGS. 11(a) and 11(b).

The device has a structure wherein the main surface 33 of the silicon substrate 10 of (100) lattice plane having an off-angle and situated lower than the other main surface 32 of the silicon substrate 10 as explained in FIGS. 10(a) and 10(b) is covering only the area where at least the semiconductor laser chip 13 can be accommodated rather than extending all the way to the end sides of the silicon substrate 10 as shown in FIGS. 11(a) and 11(b), while the structure of the reflecting mirror surface 12 or the semiconductor laser chip 13 remains the same as shown in FIGS. 10(a) and 10(b).

Figure 12:
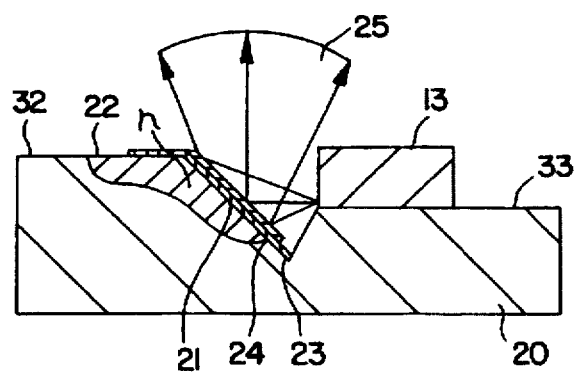
FIG. 12 shows a cross-sectional view of a semiconductor laser device according to an exemplary embodiment of the present invention having a photodiode formed at the side of a reflecting mirror surface.

Next, a semiconductor laser device as a third exemplary embodiment of the present invention will be explained with the help of a cross-sectional view as shown in FIG. 12.

The device has a structure wherein a V-groove as was shown in FIGS. 10(a) and 10(b) is formed on a p-type silicon substrate 20 of (511) lattice plane having an off-angle of some 6° about a rotation axis of <110> direction, a slanting surface of V-groove making an angle closest to 45° with the surface of the silicon substrate 20 is used as a reflecting mirror surface 21 where laser light is reflected, a main surface 33 of the silicon substrate 20 opposing to the reflecting mirror surface is made lower than the other main surface 32, an n-type diffusion region 22 is formed at the side of the p-type silicon substrate 20 of the reflecting mirror surface 21, a silicon oxide film 23 for insulation and a thin gold film 24 are formed sequentially on the reflecting mirror surface 21, and a laser chip 13 is mounted on the silicon substrate 20 with the lower ridge of the front end surface of the laser chip 13 disposed in parallel with the ridge of the surface situated opposite to the reflecting mirror surface 21.

Further, the thin gold film 24 is made half transparent by controlling its thickness within a range of 500 A to 1000 A in order to enable a part of the laser light to get to a photodiode formed of the p-type silicon substrate 20 and n-type diffusion region 22.

According to the foregoing structure, a part of the laser light radiated from the laser chip 13 in the horizontal direction is passed through the half transparent film formed of the thin gold film 24 to get to the photodiode and the rest is reflected by the half transparent film, as shown by an optical path 25, in the vertical or nearly vertical direction and taken out as output light.

The light irradiated on the photodiode is converted to an electric current signal according to the light intensity, and the electric current signal is fed back to a laser chip driving circuit to keep the laser light output constant. Also, the same effect as above can be achieved even when the conductivity types are reversed between the silicon substrate 20 and the diffusion region 22.

Figure 13:
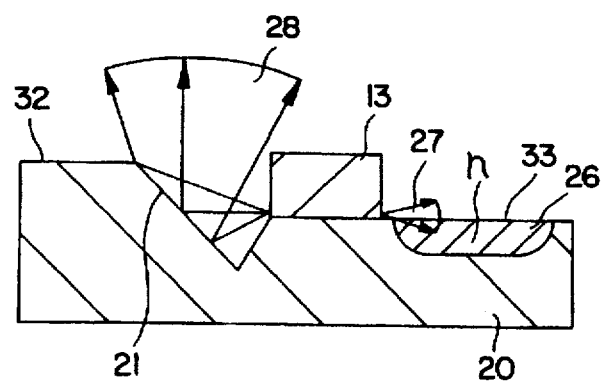
FIG. 13 and FIG. 14 respectively show cross-sectional views of semiconductor laser devices according to an exemplary embodiment of the present invention having a photodiode formed behind the laser chip.

Next, a semiconductor laser device as a fourth exemplary embodiment of the present invention will be explained with the help of cross-sectional views shown in FIG. 13 and FIG. 14.

Figure 14:
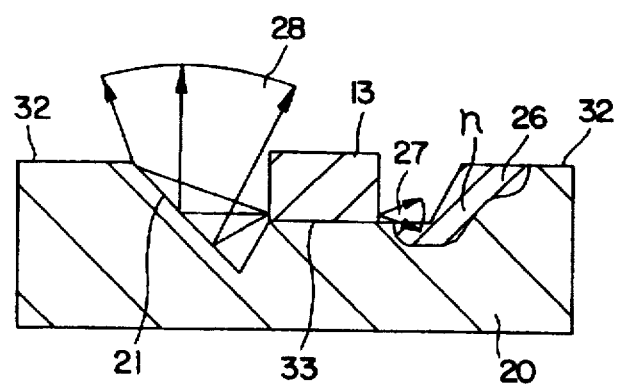

The device has a structure wherein a V-groove as was shown in FIGS. 10(a) and 10(b) is formed on a p-type silicon substrate 20 of (100) lattice plane having an off-angle of some 6° about a rotation axis of <110> direction, a slanting surface of the V-groove making an angle closest to 45° with the surface of the silicon substrate 20 is used as a reflecting mirror surface 21 where laser light is reflected, a main surface 33 of the silicon substrate 20 opposing to the reflecting mirror surface is made lower than the other main surface 32, a laser chip 13 is mounted on the silicon substrate 20 with the lower ridge of the front end surface of the laser chip 13 disposed in parallel with the ridge of the surface situated opposite to the reflecting mirror surface, and an n-type diffusion region 26 is formed in an area behind the laser chip 13 on the main surface 33 of the p-type silicon substrate 20 or in an area covering the slanting surface which connects the level difference formed of the main surfaces 32 and 33, and the vicinity thereof as shown in FIG. 14.

The laser light radiated from the back end surface of the semiconductor laser chip 13 is irradiated on a photodiode formed of the p-type silicon substrate 20 and the n-type diffusion region 26, and an electric current signal is generated with its magnitude changing according to the light intensity. The electric current signal is fed back to a laser chip driving circuit and used as a monitor for keeping constant the intensity of the laser light radiated from the front end surface of the semiconductor laser chip 13. The same effect as above can be achieved even when the conductivity types are reversed between the silicon substrate 20 and the diffusion region 26.

The laser light radiated from the front end surface of the semiconductor laser chip 13 in the horizontal direction is reflected by the reflecting mirror surface 21 coated with a thin gold film in the vertical or nearly vertical direction, and taken out as output light.

The symbol numbers 27 and 28 show optical paths of the laser light radiated from the back end surface and the front end surface of the semiconductor laser chip 13, respectively.

Figure 15:
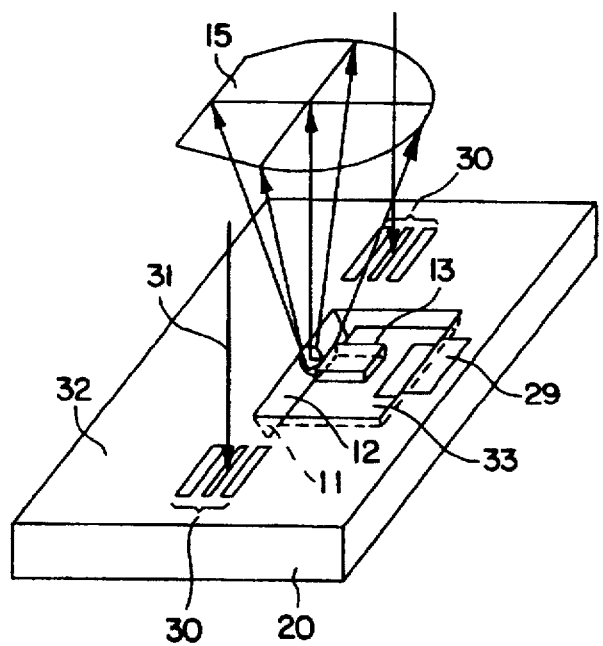
FIG. 15 shows a perspective view of a semiconductor laser device according to an exemplary embodiment of the present invention having various kinds of elements formed on the silicon substrate where a laser chip is mounted.

Next, a semiconductor laser device as a fifth exemplary embodiment of the present invention will be explained with the help of a perspective view shown in FIG. 15.

The device has a structure wherein a V-groove 11 with both slanting surfaces having (111) lattice plane is formed on a p-type silicon substrate 20 of (511) lattice plane having an off-angle of some 6° about a rotation axis of <110> direction, one of the slanting surfaces making an angle closer to 45° with the surface of the silicon substrate 20 is used as a reflecting mirror surface 12, a main surface 33 of the silicon substrate 20 opposing to the reflecting mirror surface is made lower than the other main surface 32, a laser chip 13 is mounted on the surface of the silicon substrate 20 with the lower ridge of the front end surface of the laser chip 13 disposed in parallel with the ridge of the surface situated opposite to the reflecting mirror surface, a laser output light detecting photodiode 29 is formed by an n-type diffusion region behind the laser chip 13, and further a signal detecting photodiode 30 is formed on the silicon substrate 20.

According to the foregoing structure, the laser light radiated from the front end surface of the laser chip 13 in the horizontal direction is reflected by the reflecting mirror surface 12 coated with a thin gold film in the vertical or nearly vertical direction as shown by an optical path 15, and taken out as output light. The foregoing output light is reflected by an object to make a signal light 31 which is fed into the signal detecting photodiode 30 for signal processing. On the other hand, the laser light radiated from the back end surface of the laser chip 13 is inputted to the laser output light detecting photodiode 29 and converted to an electric current signal according to the light intensity. The electric current signal is fed back to a laser chip driving circuit and used for keeping constant the output of the laser light radiated from the front end surface of the laser chip.

With the foregoing structure, it is possible to put together the whole assembly in a compact integrated unit because the laser output light detecting photodiode 29 and signal detecting photodiode 30 are formed on the same silicon substrate.

Although the laser output light detecting photodiode 29 and the signal detecting photodiode 30 only were formed on the same silicon substrate with the foregoing exemplary embodiment, it is also possible to form an amplifying circuit for signals outputted from photodiodes, the driving circuit of the laser chip, a light signal processing circuit and the like on the same silicon substrate. Besides, the same effect as the foregoing can be achieved even when the conductivity types are reversed between the substrate and the diffusion region. Further, the laser output light detecting photodiode can be made with the structure as is previously described in FIG. 12.

EXAMPLE 3

A semiconductor laser device as a first exemplary embodiment of the present invention will be explained with the help of a perspective view and a cross-sectional view shown in FIGS. 16(a) and 16(b).

The device has a structure wherein a V-shaped groove 11 (referred to as a V-groove hereafter) having both the slanting surfaces formed of (111) lattice plane is disposed on a silicon substrate 10 of (511) lattice plane having an off-angle of some 6° about a rotation axis of <110> direction, one of the slanting surfaces making an angle θ closer to 45° with the surface of the silicon substrate 10 is used as a reflecting mirror surface 12, and a semiconductor laser chip 13 is mounted on the surface of the silicon substrate 10 so as to have the lower ridge of the front end surface of the laser chip 13 disposed in parallel with the ridge of the other slanting surface of the V-groove opposing to said reflecting mirror surface 12.

Such a V-groove having slanting surfaces of (111) lattice plane can be readily realized by the steps of forming an oxide film etching mask on the silicon substrate 10, and etching with an anisotropic etching solution such as potassium hydroxide solution, ethylendiamine or the like.

Besides, a thin gold film 14 of 3000 A to 5000 A is formed on the reflecting mirror surface 12 to gain reflectivity of more than 90%. Further, the laser chip 13 is mounted by soldering with its light radiating surface side face down.

According to the foregoing structure, about one half of the laser light radiated from the laser chip 13 in the horizontal direction is reflected by the reflecting mirror in the vertical or nearly vertical direction as shown by an optical path 15, and taken out as output light.

With the present exemplary embodiment, the case of a V-groove was described, but the same effect can be obtained even when a trapezoid-shaped groove having the top part of the V-groove flattened is employed.

Although (511) lattice plane having an off-angle of some 6° was used as the silicon substrate surface, use of (511) lattice plane with a more practical off-angle ranging from 1° to 11° can be equally good. At this time, the variation spread of the slanting angle θ between the reflecting mirror surface 12 and the surface of the silicon substrate 10 can be suppressed to a range of 40°≦θ≦50°, resulting in almost the same effect because a reflecting mirror surface 12 of close to 45° is realized. Besides, by employing a silicon substrate equivalent to the foregoing silicon substrate 10 with (100) lattice plane having an off-angle ranging from 4° to 14° about an axis of <110> direction or other equivalent silicon substrates with different lattice planes having appropriate off-angles, it is possible to achieve the same effect. The same thing can be said of other exemplary embodiments that will follow.

Figure 16A:
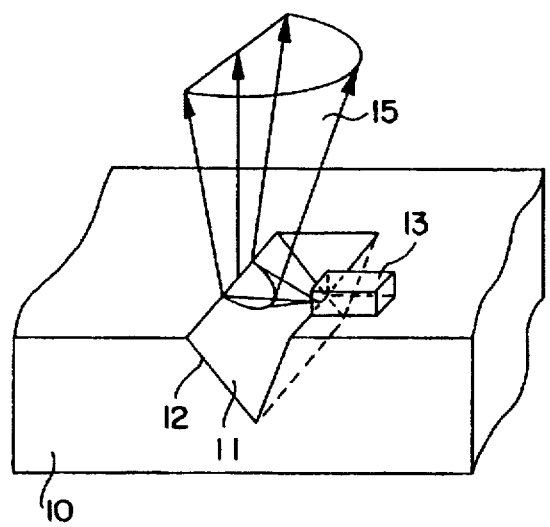
FIG. 16(a) shows a perspective view and FIG. 16(b) shows a cross-sectional view of a semiconductor laser device according to an exemplary embodiment of the present invention having a V-shaped groove.
Figure 16B:
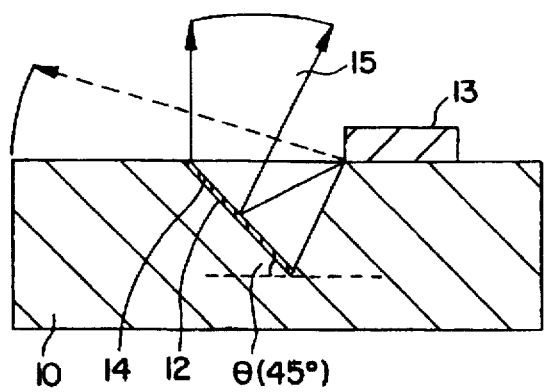

Also, the laser chip 13 may be mounted with its light radiating surface side (crystal growth surface side) faced upward instead of fixing its light radiating surface side serving as the adhesion surface as shown in FIGS. 16(a) and 16(b), but in this case the position of radiating light point varies from device to device because of a rather large spread in the laser chip thickness extending as widely as ≦20 um. Therefore, mounting the laser chip 13 with its light radiating surface side face down results in reducing the spread of variations in the distance of the radiating light point from the silicon substrate 10 to the level of ±2 um, and contributing effectively to enhancement of the positional accuracy of the light radiating point. The positional accuracy of the light radiating point is very important when the semiconductor laser device is used in a light pick-up device. This effect equally applies to other exemplary embodiments that will be described later.

Next, a semiconductor laser device according to a second exemplary embodiment of the present invention will be explained with the help of a perspective view shown in FIG. 17.

The device has a structure wherein a quadrangular pyramid like concaved 16 having four side surfaces of (111) lattice plane is formed on a silicon substrate 10 of (100) lattice plane off-angled as explained in FIGS. 16(a) and 16(b), one of the four side surfaces of (111) lattice plane making an angle closest to 45° with the surface of the silicon substrate 10 is used as a reflecting mirror surface 17 where laser light is reflected, and a laser chip 13 is mounted on the silicon substrate 10 with the lower ridge of the front end surface of the laser chip 13 disposed in parallel with the ridge 18 of the side surface of the quadrangular pyramid like concaved area 16 opposing to the reflecting mirror surface 17. The structure of the reflecting mirror surface 17 and that of the laser chip 13 are the same as explained in FIGS. 16(a) and 16(b).

According to the foregoing structure, about one half of the laser light radiated from the laser chip 13 in the horizontal direction is reflected by the reflecting mirror 17, as shown by an optical path 19, in the vertical or nearly vertical direction, and taken out as output light.

Although an explanation was made on the case of a quadrangular pyramid like concaved area with the present exemplary embodiment, a truncated quadrangular pyramid shape having the top part of said concaved area flattened can be employed as well.

Figure 18:
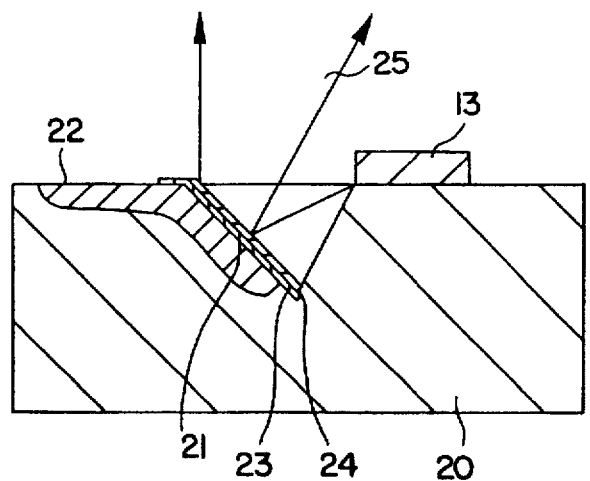
FIG. 18 shows a cross-sectional view of a semiconductor laser device according to an exemplary embodiment of the present invention having a photodiode formed at the side of a reflecting mirror surface.

Next, a semiconductor laser device as a third exemplary embodiment of the present invention will be explained with the help of a cross-sectional view shown in FIG. 18.

Figure 17:
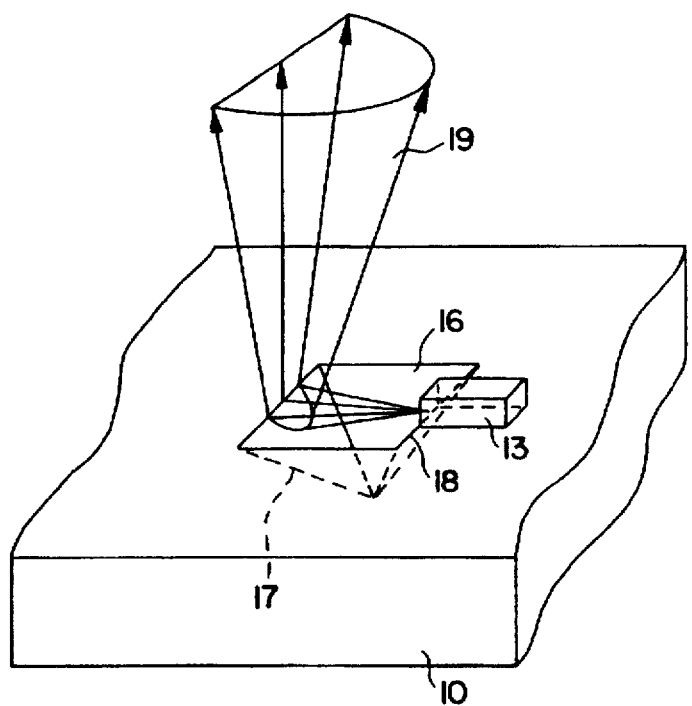
FIG. 17 shows a perspective view of a semiconductor laser device according to an exemplary embodiment of the present invention having a quadrangular pyramid like concaved area.

The device has a structure wherein a V-groove as shown in FIGS. 16(a) and 16(b) or a quadrangular pyramid like concaved area as shown in FIG. 17 is formed on a p-type silicon substrate 20 of (511) lattice plane having an off-angle of some 6° about a rotation axis of <110> direction, a slanting surface of said V-groove or concaved area making an angle closest to 45° with the surface of the silicon substrate 20 is used as a reflecting mirror surface 21 where laser light is reflected, an n-type diffusion region 22 is formed on said slanting surface at the side of the n-type silicon substrate 20, a silicon oxide film 23 for insulation and a thin gold film 24 are formed sequentially on the reflecting mirror surface 21, and a laser chip 13 is mounted on the silicon substrate 20 with the lower ridge of the front end surface of the laser chip 13 disposed in parallel with the ridge of the slanting surface opposing to the reflecting mirror surface 21.

Further, the thin gold film 24 is made half transparent by controlling the thickness thereof within a range of 500 A to 1000 A in order for a part of the laser light to get to a photodiode formed on the p-type silicon substrate 20 and the n-type diffusion region 22.

According to the foregoing structure, a part of the laser light radiated from the laser chip 13 in the horizontal direction is passed through the half transparent film formed of the thin gold film 24 to get to the photodiode and the rest is reflected by the half transparent film, as shown by an optical path 25, in the vertical or nearly vertical direction and taken out as output light.

The light irradiated on the photodiode is converted to an electric current signal according to the light intensity, and the electric current signal is fed back to a laser chip driving circuit to keep the laser light output constant. Also, the same effect as the foregoing can be achieved even when the conductivity types are reversed between the silicon substrate 20 and the diffusion region 22.

Figure 19:
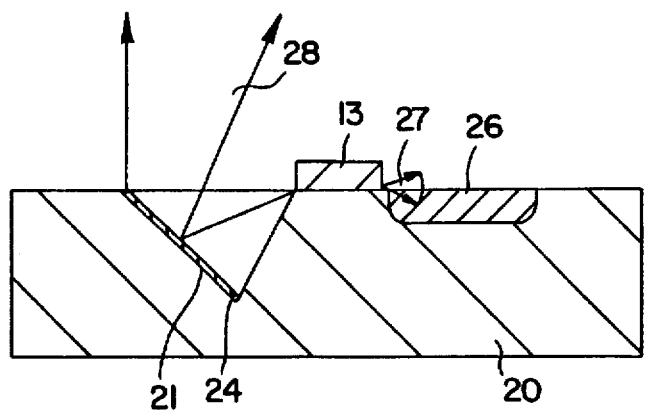
FIG. 19 shows a cross-sectional view of a semiconductor laser device according to an exemplary embodiment of the present invention having a photodiode formed behind a laser chip.

Next, a semiconductor laser device as a fourth exemplary embodiment of the present invention will be explained with the help of a cross-sectional view shown in FIG. 19.

The device has a structure wherein a V-groove as shown in FIGS. 16(a) and 16(b) or a quadrangular pyramid like concaved area as shown in FIG. 17 is formed on a p-type silicon substrate 20 of (511) lattice plane having an off-angle of some 6° about a rotation axis of <110> direction, a slanting surface of said V-groove or concaved area making an angle closest to 45° with the surface of the silicon substrate 20 is used as a reflecting mirror surface 21 where laser light is reflected, a laser chip 13 is mounted on the silicon substrate 20 with the lower ridge of the front end surface of the laser chip 13 disposed in parallel with the ridge of the slanting surface opposing to the reflecting mirror surface 21, and an n-type diffusion region 26 is formed on the p-type silicon substrate 20 at a position behind the laser chip 13.

The laser light radiated from the back end surface of the semiconductor laser chip 13 is irradiated on a photodiode formed of the p-type silicon substrate 20 and the n-type diffusion region 26, and an electric current signal is generated with its magnitude changing according to said light intensity. The electric current signal is fed back to a laser chip driving circuit and used as a monitor for keeping constant the intensity of the laser light radiated from the front end surface of the semiconductor laser chip 13. The same effect as above can be achieved even when the conductivity types are reversed between the silicon substrate 20 and the diffusion region 26.

The laser light radiated from the front end surface of the semiconductor laser chip 13 in the horizontal direction is reflected by the reflecting mirror surface 21 coated with a thin gold film in the vertical or nearly vertical direction, and taken out as output light.

The symbol numbers 27 and 28 show optical paths of the laser light radiated from the back end surface and the front end surface of the semiconductor laser chip 13, respectively.

Figure 20:
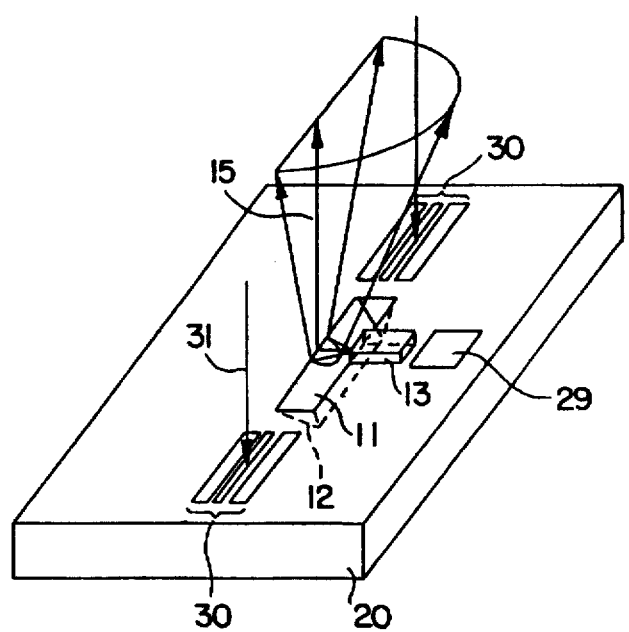
FIG. 20 a perspective view of a semiconductor laser device according to an exemplary embodiment of the present invention having various kinds of elements formed on the silicon substrate were a laser chip is mounted.
Figure 21:
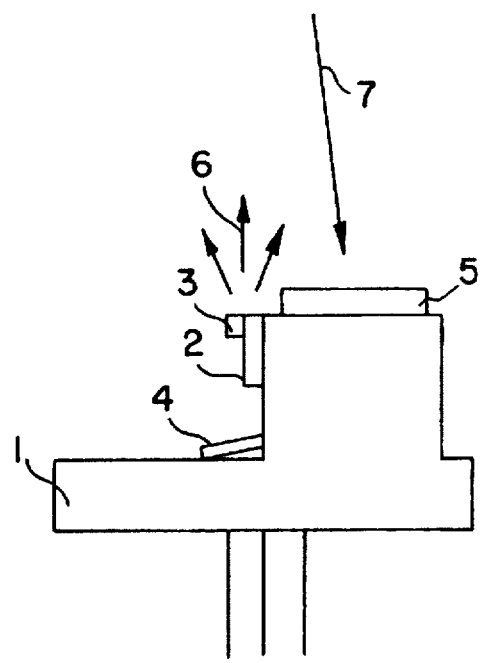
FIG. 21 shows a cross-sectional view of a prior art semiconductor laser having a laser chip disposed on an element mounting base.
Figure 22:
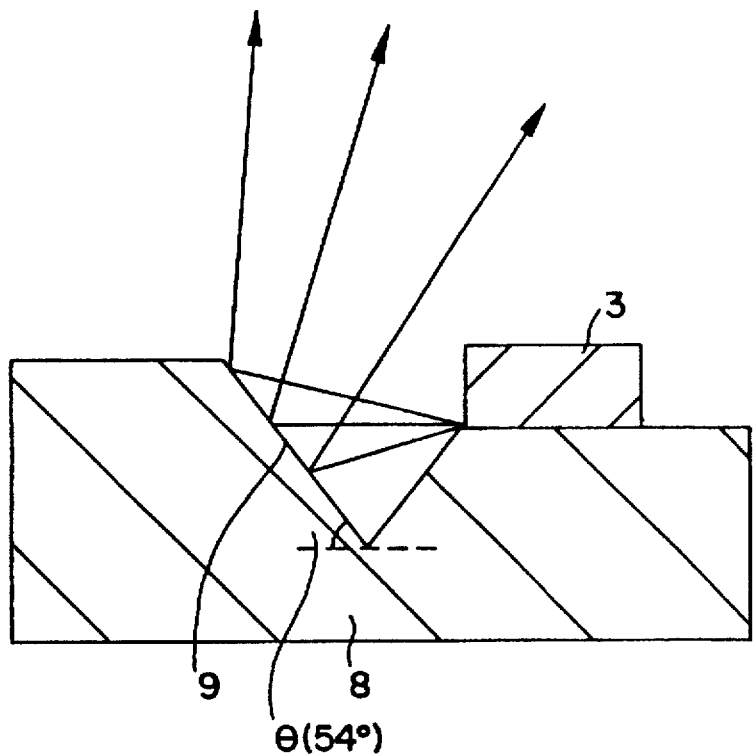
FIG. 22 shows a cross-sectional view of a prior art semiconductor laser device having a laser chip mounted on a silicon substrate.

Next, a semiconductor laser device as a fifth exemplary embodiment of the present invention will be explained with the help of a perspective view shown in FIG. 20.

The device has a structure wherein a V-groove with both the slanting surfaces formed of (111) lattice plane is disposed on a p-type silicon substrate 20 of (511) lattice plane having an off-angle of some 6° about a rotation axis of <110> direction, one of the slanting surfaces making an angle closest to 45° with the surface of the silicon substrate 20 is used as a reflecting mirror surface 12, a laser chip 13 is mounted on the surface of the silicon substrate 20 with the lower ridge of the front end surface of the laser chip 13 disposed in parallel with the ridge of the slanting surface opposing to the reflecting mirror surface 12, a laser output light detecting photodiode 29 is disposed by forming an n-type diffusion region behind the semiconductor laser chip 13, and further a signal detecting photodiode 30 is disposed on the silicon substrate 20.

According to the foregoing structure, the laser light radiated from the front end surface of the laser chip 13 in the horizontal direction is reflected by the reflecting mirror surface 12 coated with a thin gold film in the vertical or nearly vertical direction as shown by an optical path 15, and taken out as output light. The foregoing output light is reflected by an object to make a signal light 31 which is fed into the signal detecting photodiode 30 for signal processing. On the other hand, the laser light radiated from the back end surface of the laser chip 13 is inputted to the laser output light detecting photodiode 29 and converted to an electric current signal according to the light intensity. The electric current signal is fed back to a laser chip driving circuit and used for keeping constant the output of the laser light radiated from the front end surface of the semiconductor laser chip.

With the of foregoing structure, it is possible to put together the whole assembly into a compact integrated unit because the laser output light detecting photodiode 29 and signal detecting photodiode 30 are formed on the same silicon substrate. Although only the laser output light detecting photodiode and signal detecting photodiode were shown with the present exemplary embodiment, it is also possible to form an amplifying circuit for signals outputted from photodiodes, the driving circuit of the semiconductor laser chip, a light signal processing circuit and the like on the same silicon substrate. Besides, the same effect as the foregoing can be achieved even when the conductivity types are reversed between the substrate and the diffusion region. Also, the laser output light detecting photodiode can be made with the structure as previously described in FIG. 18.

In the foregoing exemplary embodiments, only the cases wherein silicon substrates of (100) lattice plane having an off-angle ranging from 4° to 14° about an axis of <110> direction and silicon substrates of (511) lattice plane having an off-angle ranging from 1° to 11° were employed have been described, but it should be noticed that the off-angle ranges, for whatever cases, correspond to a range of the angles between the reflecting mirror surfaces and the main surfaces of silicon substrates extending over 40° to 50°.

EXAMPLE 4

A semiconductor laser device of the present invention will be explained with the help of a cross-sectional view shown in FIG. 23.

Figure 23:
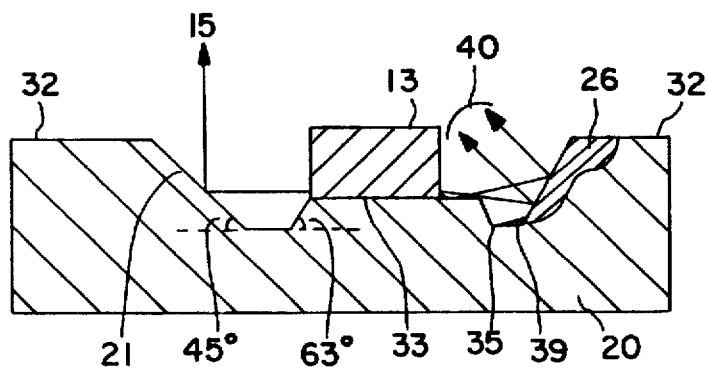
FIG. 23 shows a cross-sectional view of a semiconductor laser device according to an exemplary embodiment of the present invention having a photodiode formed behind a laser chip.

The device has a structure wherein a trapezoid-shaped groove as shown in FIG. 23 is formed on a p-type silicon substrate 20 of (100) lattice plane having an off-angle of 4° to 14° about a rotation axis of <110> direction. A slanting surface 21 of the trapezoid-shaped groove makes an angle of approximately 45° with the surface of silicon substrate 20 and is used as a reflecting mirror surface where laser light is reflected. A main surface 33 of the silicon substrate 20 opposing the reflecting mirror surface 21 is made lower than the other main surface 32. A laser chip 13 is mounted on the silicon substrate 20 with the lower ridge of the front end surface of the laser chip 13 disposed in parallel with the ridge of the surface situated opposite to the reflecting mirror surface. A concave area 35 is formed behind and apart from the position where the semiconductor chip 13 is mounted. The cross-section of the concave area is V-shaped or trapezoid-shaped. An n-type diffusion region 26 is formed in an area behind the laser chip 13 in an area covering the slanting surface between main surface 32 and the concave surface 35 and the vicinity thereof as shown in FIG. 23.

The laser light radiated from the back end surface of the semiconductor laser chip 13 is irradiated on a photodiode formed of the p-type silicon substrate 20 and the n-type diffusion region 26, and an electric current signal is generated with its magnitude changing according to the light intensity. The electric current signal is fed back to a laser chip driving circuit and used as a monitor for keeping constant the intensity of the laser light radiated from the front end surface of the semiconductor laser chip 13. The same effect as above can be achieved even when the conductivity types of the silicon substrate 20 and the diffusion region 26 are reversed.

The laser light radiated from the front end surface of the semiconductor laser chip 13 in the horizontal direction is reflected by the reflecting mirror surface 21 coated with a thin gold film in the vertical or nearly vertical direction, and taken out as output light.

The reference numbers 40 and 15 show optical paths of the laser light radiated from the back end surface and the front end surface of the semiconductor laser chip 13, respectively.

The device shown in FIG. 23 is effective to eliminate undesirable reflected laser light beams 36 and 37 (shown in FIGS. 24 and 25) perpendicular to the main surface of the silicon substrate. The undesirable reflected laser light beams become a cause of degradation of the S/N ratio of light pick-up device characteristics.

Figure 24:
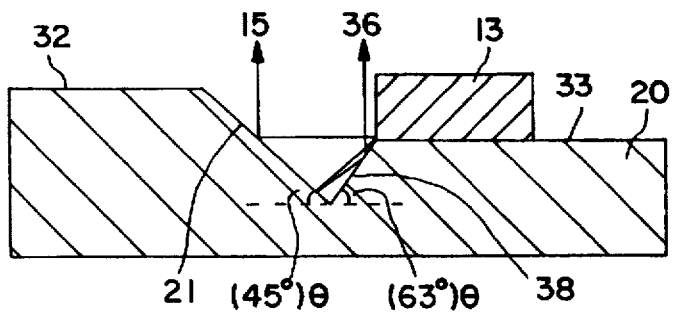
FIG. 24 shows undesirable reflected laser light eliminated by the device shown in FIG. 23.

As shown in FIG. 24, a laser light radiated downwardly from the laser chip 13 is reflected by a 45° mirror 21 and 63° mirror 38, thus an undesirable reflected laser light 36 is produced. The undesirable reflected laser light 36 can be eliminated by making the groove trapezoidal as shown in FIG. 23.

Figure 25:
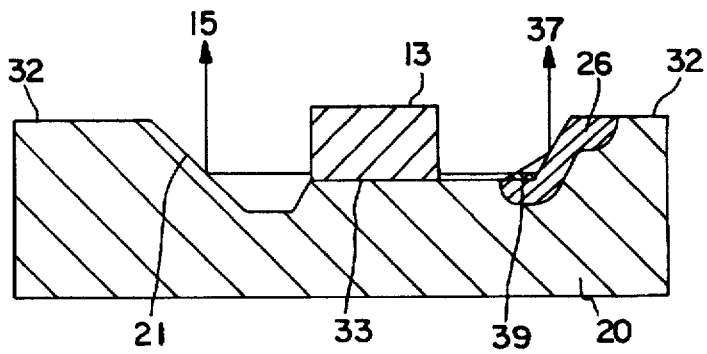
FIG. 25 shows undesirable reflected laser light eliminated by the device of FIG. 23.

As for undesirable reflected light 37 shown in FIG. 25, it is produced by (100) plane 39. That is, as described in the foregoing examples, the slanting surface of (111) lattice plane is formed by using an anisotropic etching solution, however, (100) lattice plane 39 which is stable next to (111) lattice plane is slightly formed. The (100) lattice plane 39 becomes a cause of the undesirable reflected light 37 as shown in FIG. 25.

Figure 26:
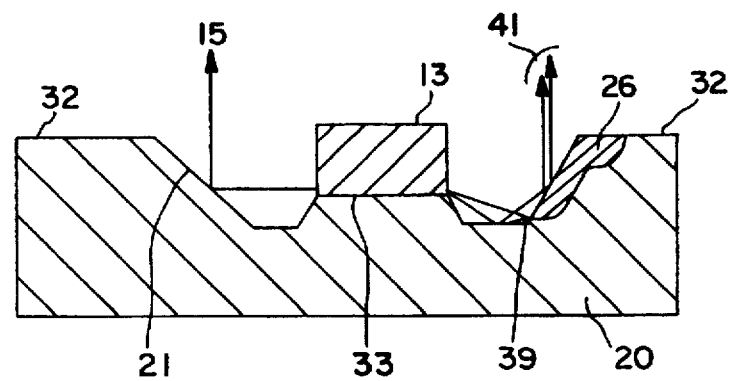
FIG. 26 shows undesirable reflected laser light eliminated by the device shown in FIG. 23.

In order to eliminate the undesirable reflection from (100) lattice plane 39, a concave area is formed behind the laser chip 13 as shown in FIG. 26. However, another undesirable reflected light 41, shown in FIG. 26 is produced. Therefore, forming a concave area behind and apart from laser chip 13, as shown in FIG. 23, is necessary to avoid the undesirable reflected light beams 37 and 41 shown in FIGS. 25 and 26.

FIGS. 27(a)–(f) show fabricating process of the present invention.

Figure 27A:
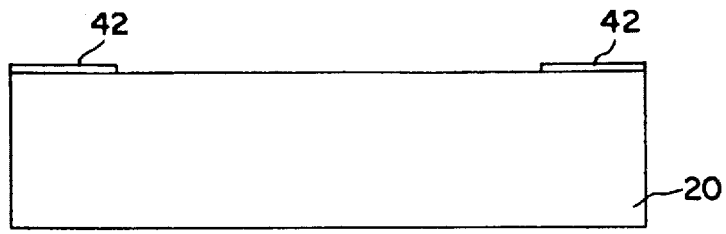
FIGS. 27(a)–(f) show the fabrication process of the device shown in FIG. 23.

As shown in FIG. 27(a), an etching mask of a silicon oxide 42 is formed on the (100) surface of a p-type silicon substrate 20.

Figure 27B:
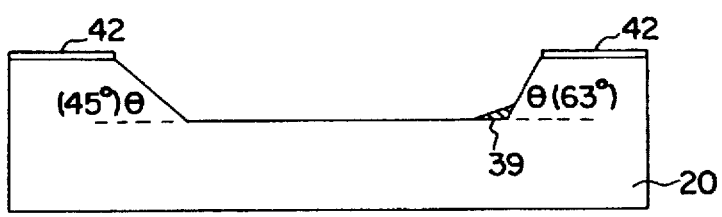

Next, as shown in FIG. 27(b), the first anisotropic etching is performed using an etching solution such as potassium hydroxide, ethylenediamine or the like. There appear two slanting surfaces of (111) lattice plane making an angle of about 45° and 63° with the substrate surface. In addition, at the bottom near (111) lattice plane of 63° with the substrate surface, (100) lattice surface 39 is produced.

Figure 27C:
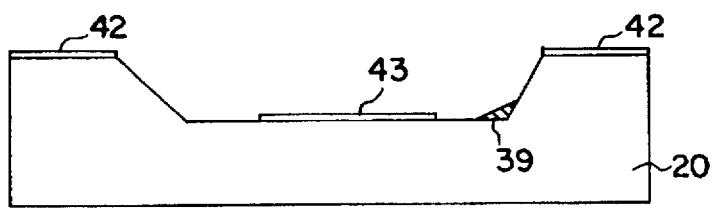

Next, as shown in FIG. 27(c), Ti thin film 43 which is insoluble in potassium hydroxide aqueous solution is deposited by evaporation and patterned.

Figure 27D:
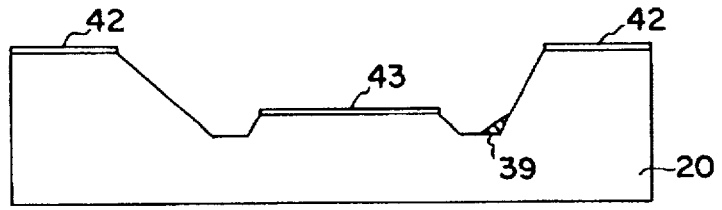

Next, as shown in FIG. 27(d), the second anisotropic etching is performed with a same etching solution using silicon oxide 42 and the Ti thin film 43 as an etching mask.

Figure 27E:

Next, as shown in FIG. 27(e), silicon oxide 42 and Ti thin film 43 are removed.

Figure 27F:
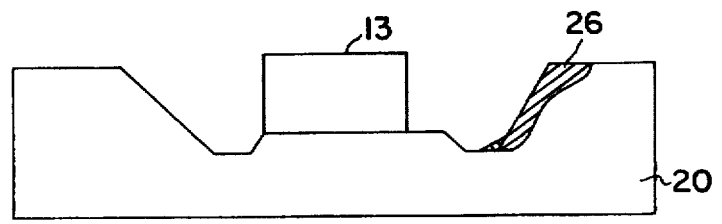

Next, as shown in FIG. 27(f), a laser chip 13 is mounted and n-type diffusion region 26 is formed.

With the semiconductor laser devices disclosed in accordance with the exemplary embodiments of the present invention, a level difference or a truncated quadrangular pyramid like concaved area both having slanting surfaces of (111) lattice plane is formed on a silicon substrate of (100) lattice plane having an off-angle ranging from 4° to 14° about an axis of <110> direction or a silicon substrate of (511) lattice plane having an off-angle ranging from 1° to 11° about an axis of <110> direction, and it is made possible for one of the slanting surfaces of (111) lattice plane to make an angle of about 45° with the surface of the silicon substrate and to be used as a reflecting mirror surface.

As a result, the laser light radiated from a laser chip in the horizontal direction is reflected by the reflecting mirror surface and can be taken out in the almost vertical direction, contributing to simplified positional adjustment along the radiating direction.

In addition, because a laser output light detecting photodiode, a signal detecting photodiode, a laser driving circuit, an amplifying circuit or a light signal processing circuit may be formed on a silicon substrate which is mounted with a laser chip and serving as a heat sink thereof, an integration of such various elements as above is realized, and also an angle adjustment and an assembly process as well can be simplified with a resultant reduction in cost.

What is claimed:

1. A semiconductor laser device comprising:
   a silicon substrate having a main surface,
   a reflecting mirror surface making an angle of approximately 45° with the main surface of said silicon substrate and having (111) lattice plane, said reflecting mirror surface is one of two opposing slanting surfaces each having a lower end separated by a further surface and forming a concave area within said silicon substrate, and a semiconductor laser chip mounted on a surface of said substrate lower than said main surface at a position opposing said reflecting mirror surface.

2. The semiconductor laser device according to claim 1, wherein said silicon substrate is a silicon substrate of (100) lattic plane having an off-angle of 4° to 14° about an axis of <110> direction.

3. A semiconductor laser device according to claim 1 wherein the cross-section of the concave area is trapezoid-shaped.

4. A semiconductor laser device comprising:

a silicon substrate having a main surface, a reflecting mirror surface making an angle approximately 45° with the main surface of said silicon substrate and having (111) lattice plane, said reflecting mirror surface is one of two opposing slanting surfaces each having a lower end separated by a further surface and forming a concave area within said silicon substrate, a semiconductor laser chip mounted on a surface of said substrate lower than said main surface at a position opposing said reflecting mirror surface, and a photodiode disposed at a position opposing said semiconductor laser chip and formed on one of the two slanting surfaces of a second concaved area, which is formed behind and apart from the position where the semiconductor laser chip is mounted, the cross-section of the second concave area being V-shaped or trapezoid-shaped.

5. The semiconductor laser device according to claim 4, wherein said silicon substrate is a silicon substrate of (100) lattic plane having an off-angle of 4° to 14° about an axis of <110> direction.

6. A semiconductor laser device according to claim 4 wherein the cross-section of the concave area is trapezoid-shaped.

* * * * *

UNITED STATES PATENT AND TRADEMARK OFFICE
CERTIFICATE OF CORRECTION

PATENT NO. : 5,793,785
DATED : August 11, 1998
INVENTOR(S) : Nakanishi et al.

It is certified that error appears in the above-identified patent and that said Letters Patent is hereby corrected as shown below:

Column 17, line 8, "lattic" should be --lattice--.

Column 18, line 14, "lattic" should be --lattice--.

Signed and Sealed this

Thirteenth Day of April, 1999

Attest:

Q. TODD DICKINSON

*Attesting Officer*    *Acting Commissioner of Patents and Trademarks*